United States Patent
Cyrusian

(10) Patent No.: US 6,617,899 B2
(45) Date of Patent: Sep. 9, 2003

(54) ULTRA HIGH SPEED CLOCKED ANALOG LATCH

(75) Inventor: Sasan Cyrusian, Scotts Valley, CA (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/865,856

(22) Filed: May 25, 2001

(65) Prior Publication Data

US 2002/0175727 A1 Nov. 28, 2002

(51) Int. Cl.[7] ............................................... H03K 3/12
(52) U.S. Cl. ..................... 327/199; 327/200; 327/201
(58) Field of Search ................................. 327/199, 200, 327/201, 203, 206, 208, 210, 64; 326/24

(56) References Cited

U.S. PATENT DOCUMENTS

| | | | | |
|---|---|---|---|---|
| 5,990,707 A | * | 11/1999 | Goldenberg et al. | 327/64 |
| 6,278,308 B1 | * | 8/2001 | Partovi et al. | 317/218 |
| 6,366,113 B1 | * | 4/2002 | Song | 326/24 |

OTHER PUBLICATIONS

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Tuan T. Lam
Assistant Examiner—Hiep Nguyen
(74) Attorney, Agent, or Firm—Brinks Hofer Gilson & Lione

(57) ABSTRACT

An ultra high-speed clocked analog latch is revealed for use at clock speeds from 100 MHz to several GHz. The analog latch is used as a latching comparator for comparing a time-varying analog signal with an analog reference voltage. The latch uses CMOS manufacturing technology and a minimal amount of space for a two-stage amplifying and signal-generating device. The latch is useful in analog to digital converters (ADCs) in which high speed and high reliability are required, but only a small amount of space is available. The device is so small and economical that several may be used in series to avoid any meta-stability problems in high-speed read/write operations.

32 Claims, 8 Drawing Sheets ically not
ULTRA HIGH SPEED CLOCKED ANALOG LATCH

RELATED APPLICATION

The present application is related to U.S. patent application Ser. No. 09/865,791, entitled Ultra High Speed Clocked Limiting Preamplifier, filed on the same day as the present application by the inventor of the present invention and assigned to the assignee of the present invention. The entire contents of the application are hereby incorporated by reference.

BACKGROUND OF THE INVENTION

The field of the invention relates to disk drives and other data storage devices. More particularly, this invention relates to disk drives having read/write channels with analog to digital converters. An analog latch is the basic building block for a high-speed analog-to-digital converter (ADC). This circuit makes a comparison between an input analog voltage signal and an internally generated reference voltage. The output of the analog latch is a digital signal, high or low, depending on whether the input voltage is higher than the reference voltage. Many such latches are used, in combination with other circuits, in forming an ADC.

FIG. 1 is a high-level block diagram of a 6-bit flash analog-to-digital converter (ADC) 100. The ADC includes an autozero control and clock generator module 102, which is connected to each of 63 analog latches 108. Each analog latch receives also an input analog voltage signal 104 and a reference voltage signal 106. Signals 104 and 106 may be differential signals. The high or low outputs of the latches 108 are sent to logic circuitry 110. Afterwards, the converted digital signals may be used in ROM 112 for ADC output, and may be used in a register 114 by other circuitry. One possible use for ADCs such as this one is for read/write operations in computers or computer peripherals or logic circuitry.

BRIEF SUMMARY

An ultra high-speed clocked analog latch is disclosed. The analog latch is used as a latching comparator for comparing a time-varying analog signal with an analog reference voltage. This latch is particularly useful in analog-to-digital converters (ADCs) having an auto-zero operation or capability. The clocked analog latch has a first clocked preamplifier, a second clocked preamplifier, a signal level shifter, at least one differential analog latch stage, and an RS latch stage. The circuit is designed for a high-speed, time varying clocked operation, including rates from about 100 MHz to several GHz.

The first clocked preamplifier receives a differential analog signal and subtracts a differential reference voltage from it. It preamplifies the resulting difference signal by a gain factor of 5 to 10. The second clocked preamplifier receives the preamplified signal of the first preamplifier and performs a second preamplification operation on the signal, for an additional gain factor of 3 to 5. The two preamplifiers together produce a gain of from 15 to 50 for a small input differential signal. While the preamplifiers are high speed, they are limited in their output voltage swing, so that a maximum output voltage from the preamplifiers is about 100–200 millivolts. An output signal from the preamplifiers may then be connected to a level shifter, to shift the absolute voltage level of the signal, with respect to a reference, such as a ground. The output of the preamplifiers is aimed primarily at discerning whether the input signal was greater or smaller than a reference voltage applied to the preamplifier.

The shifted voltage signal is then processed by at least one clocked analog latch stage. The analog stages have a very high gain, but the gain is limited to that which is possible in a very short period of time, such as about 1 nanosecond. The output of one or more analog latch stages is a voltage signal of about zero to 0.1 volts or is about 0.7 volts. This signal is transmitted to an RS latch, where the signal remains during the following reset state of the previous latch stage. The signal on the RS latch is the output of the high speed clocked analog latch, read and used by other components of a read/write circuit, as shown in FIG. 1.

DETAILED DESCRIPTION OF THE PRESENTLY PREFERRED EMBODIMENTS

In the discussion below, transistors are described as CMOS transistors, and in particular as p-channel MOS (PMOS) or n-channel MOS (NMOS) transistors. Those skilled in the art will recognize that the terms p-channel and n-channel might more accurately describe the transistors discussed herein, since these transistors are typically not manufactured by depositing metallic elements, except possibly for external connections. Rather, source and drain regions are doped to either p-type or n-type, indicating whether the channel between source and drain conducts via depletion mode (holes) or enhancement mode (electrons). Nevertheless, the terms PMOS and NMOS are more-commonly used, and are so used herein to mean those transistors manufactured by CMOS processes.

Figure 1:
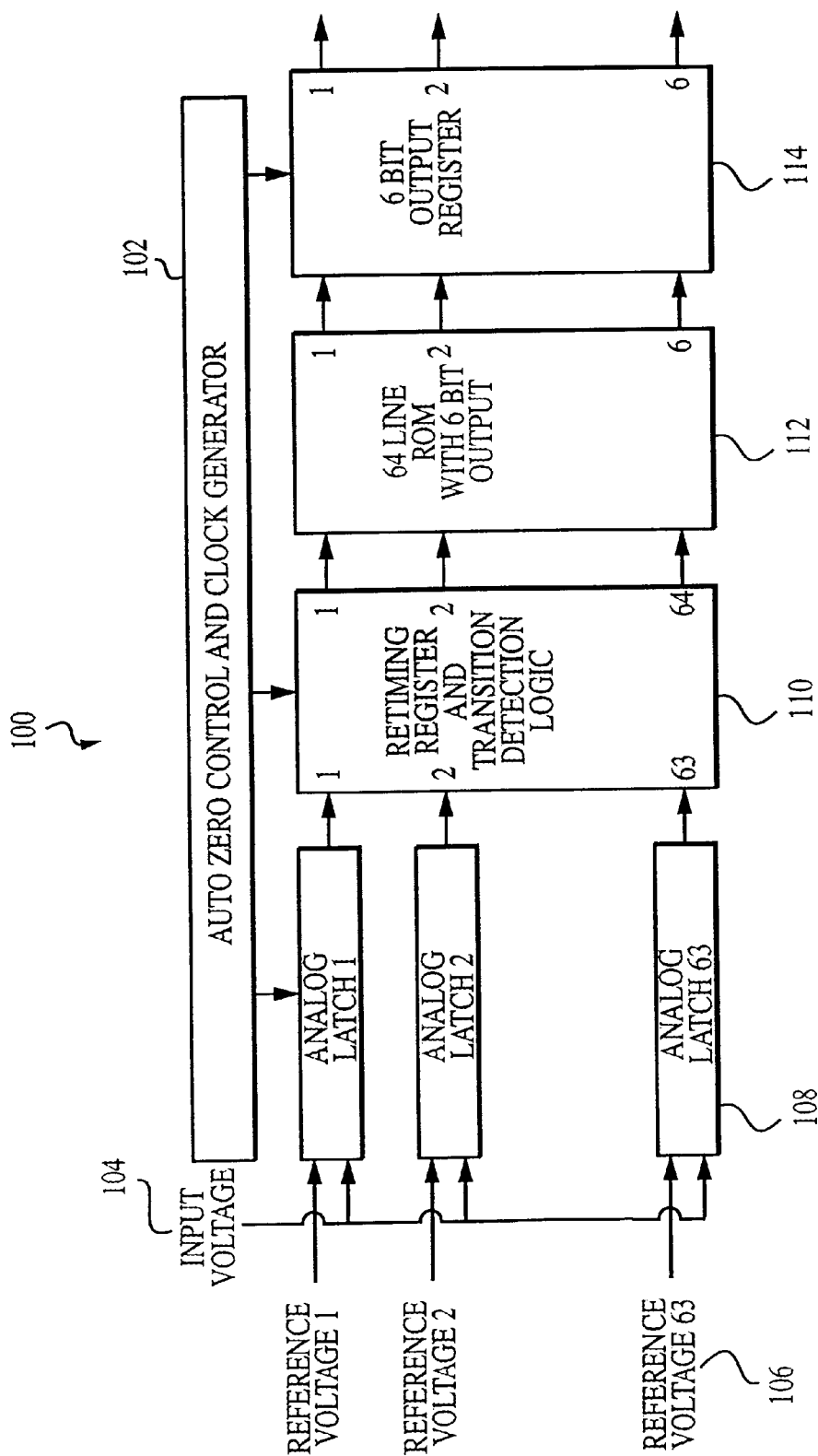
FIG. 1 is a top level block diagram of a 6-bit flash analog-to digital converter (ADC).
Figure 2:
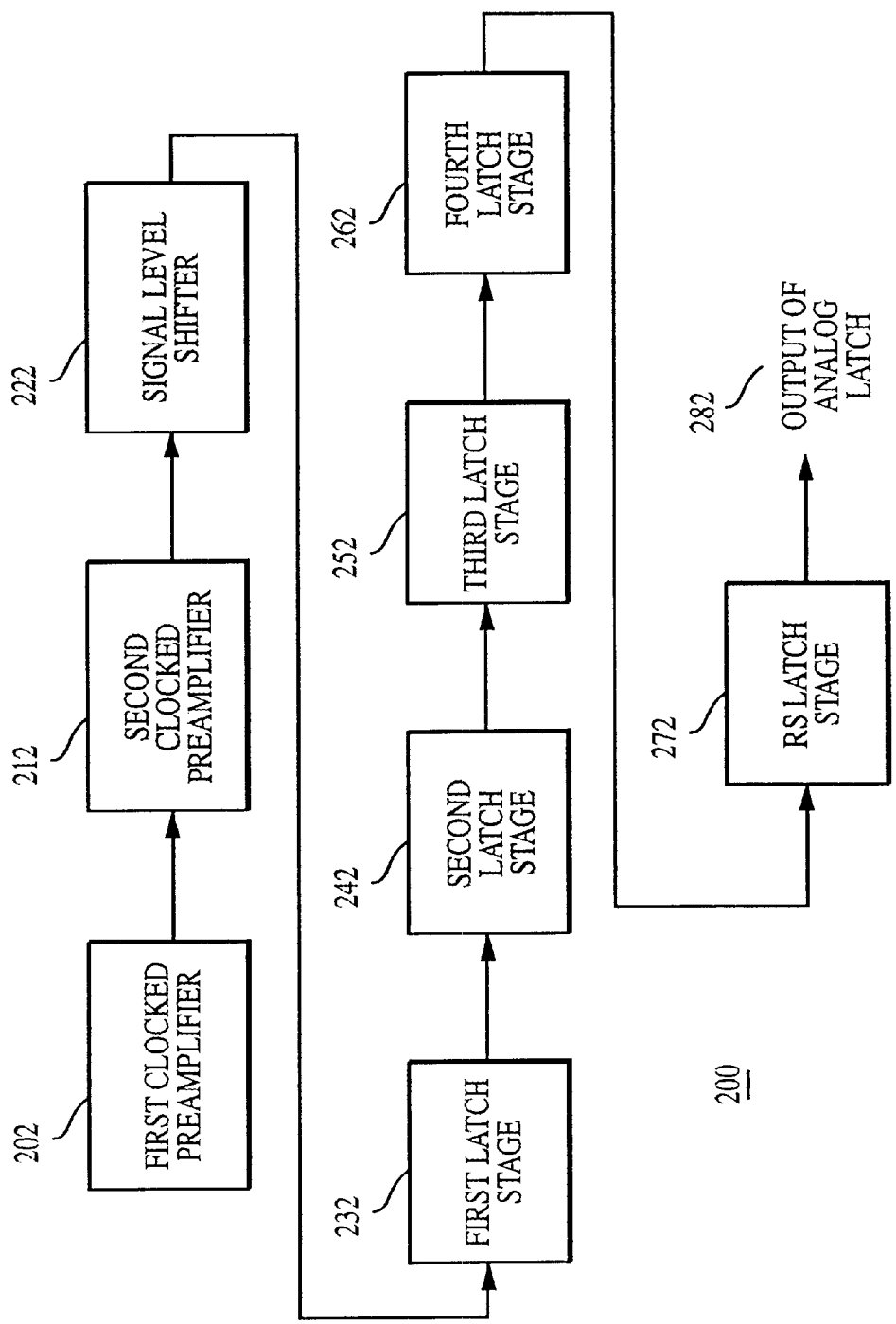
FIG. 2 is a block diagram depicting elements of an improved analog latch.
Figure 3:
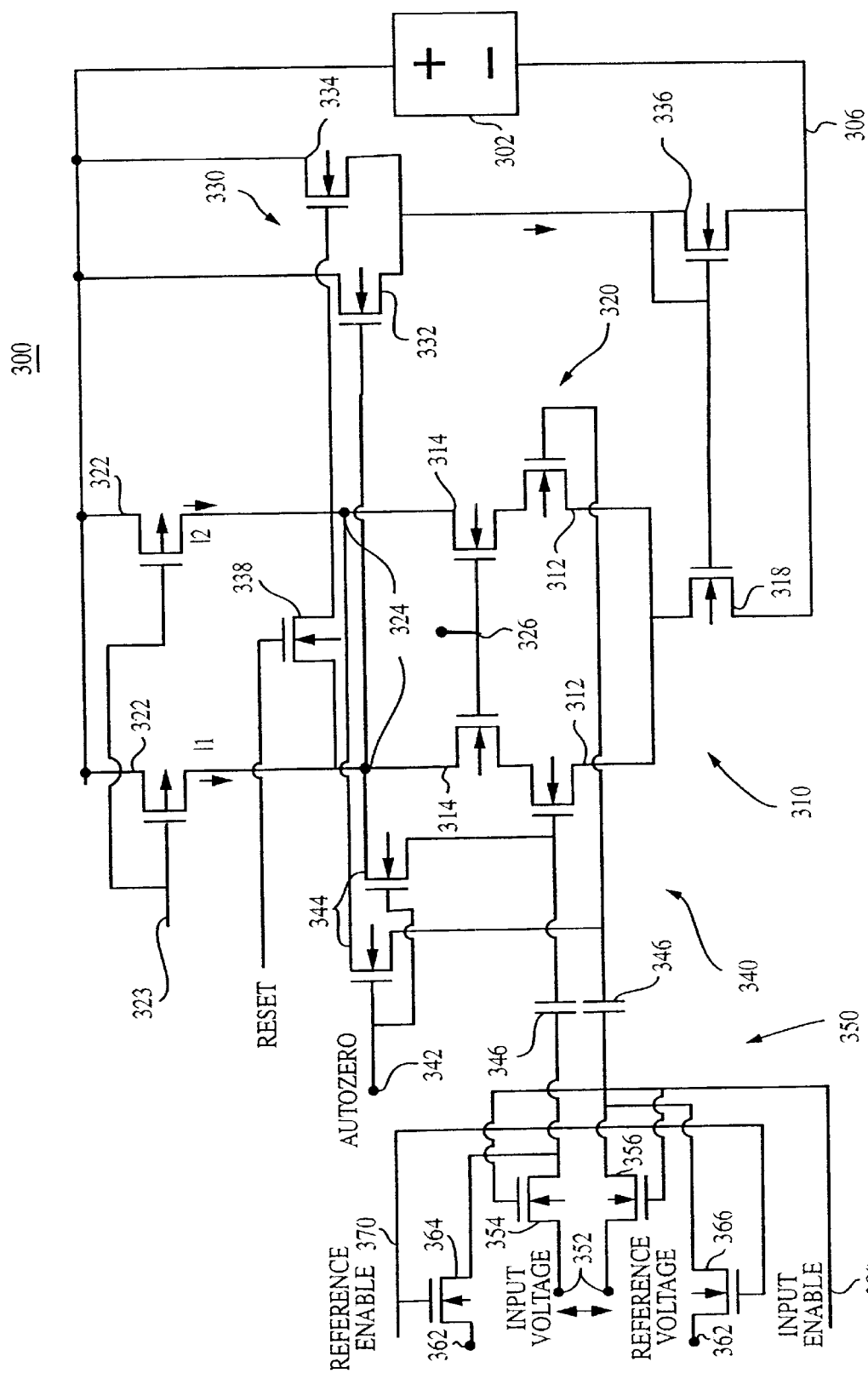
FIG. 3 is a first stage preamplifier for high gain.
Figure 4:
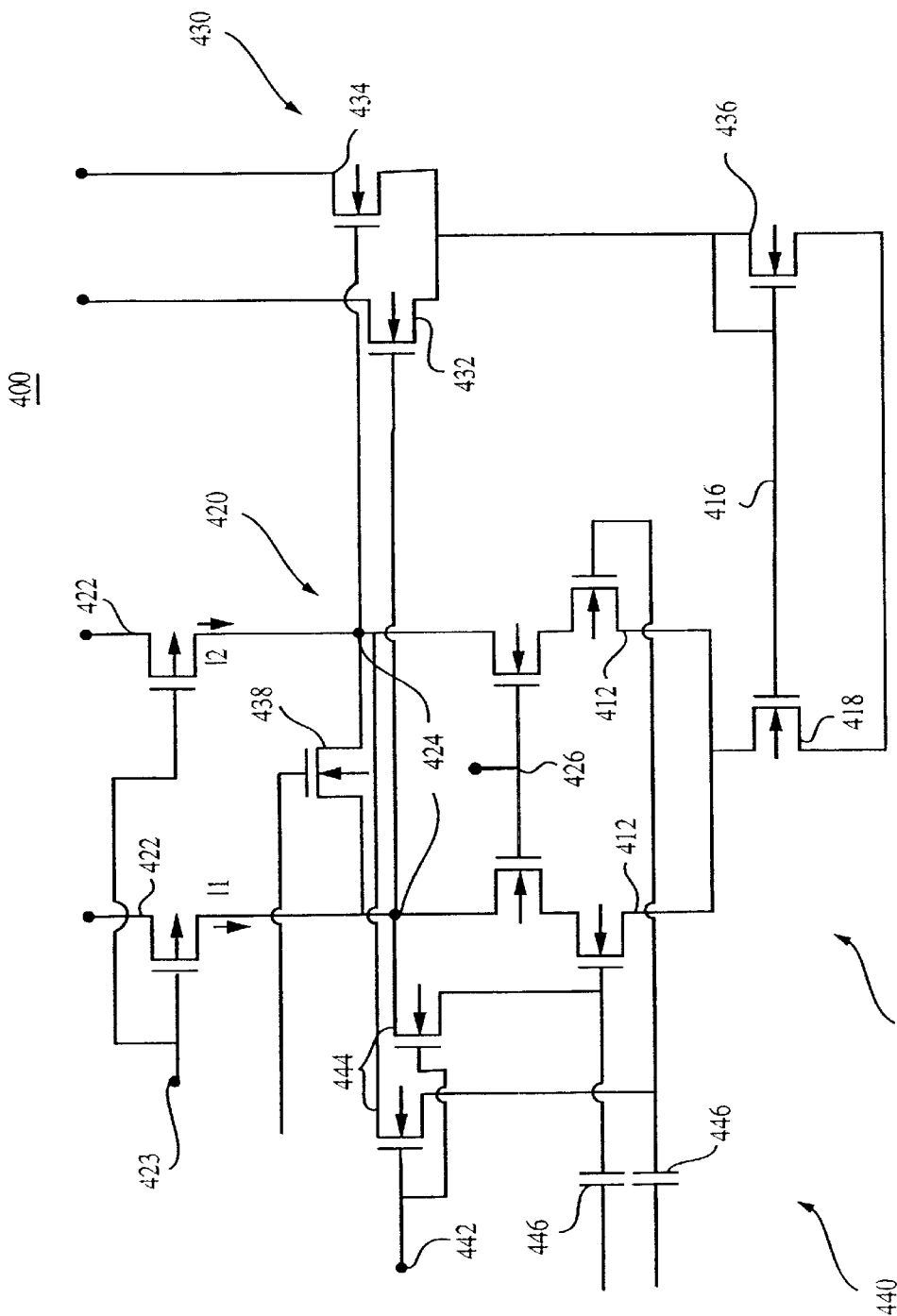
FIG. 4 is a second stage preamplifier for high gain.
Figure 5:
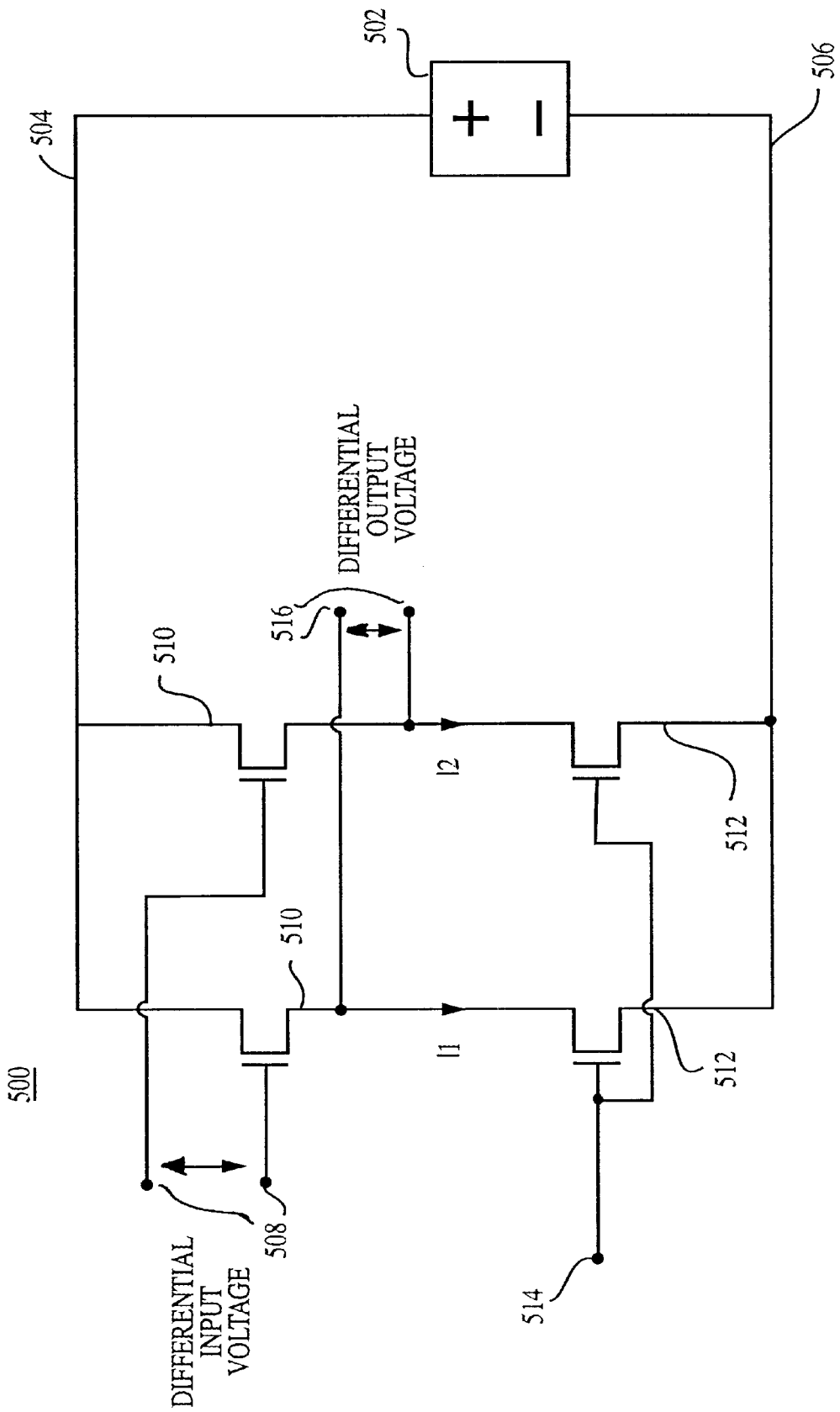
FIG. 5 is a level shifter used in an improved ADC latch
Figure 6:
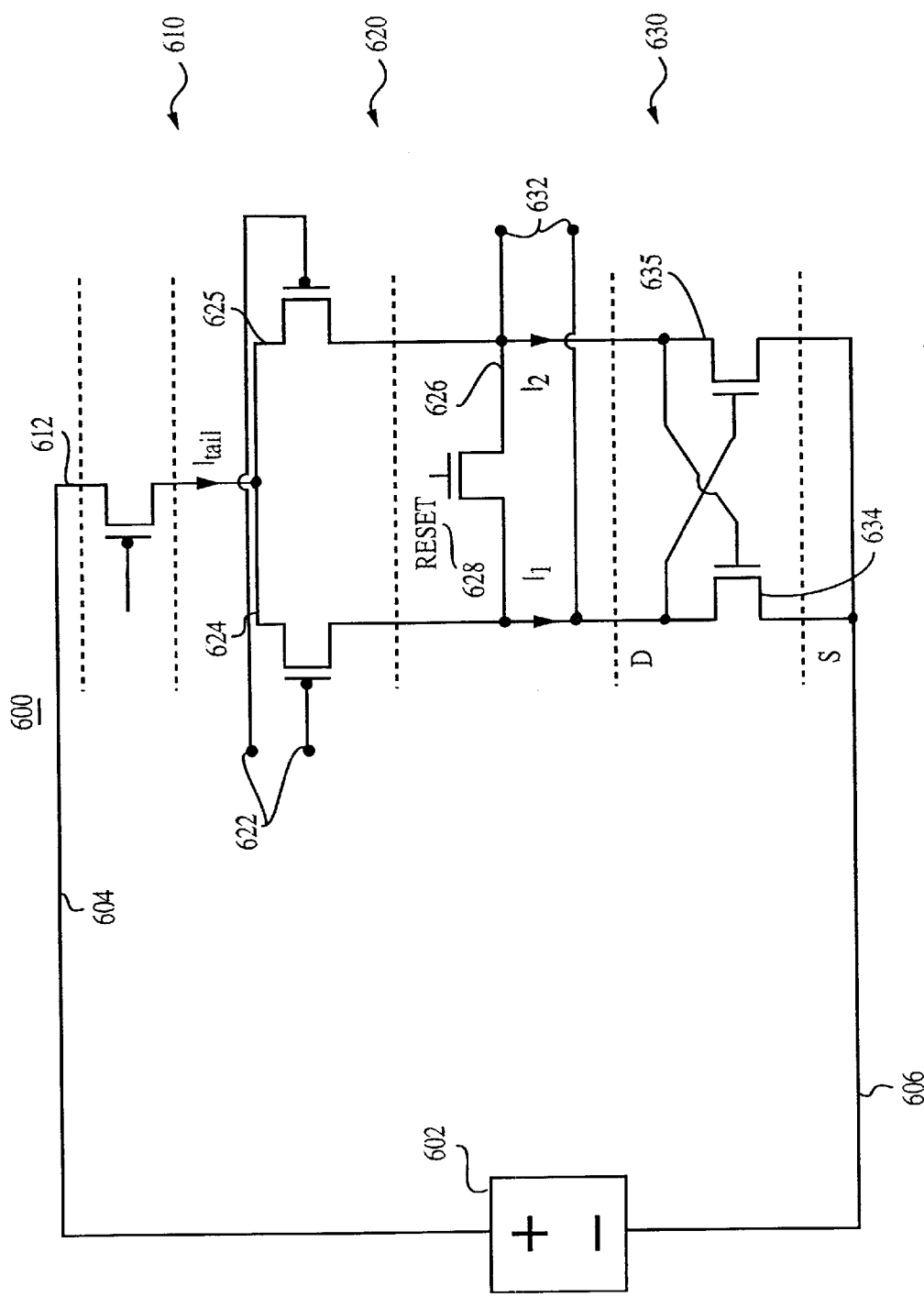
FIG. 6 is an ultra high-speed clocked differential analog latch stage.
Figure 7:
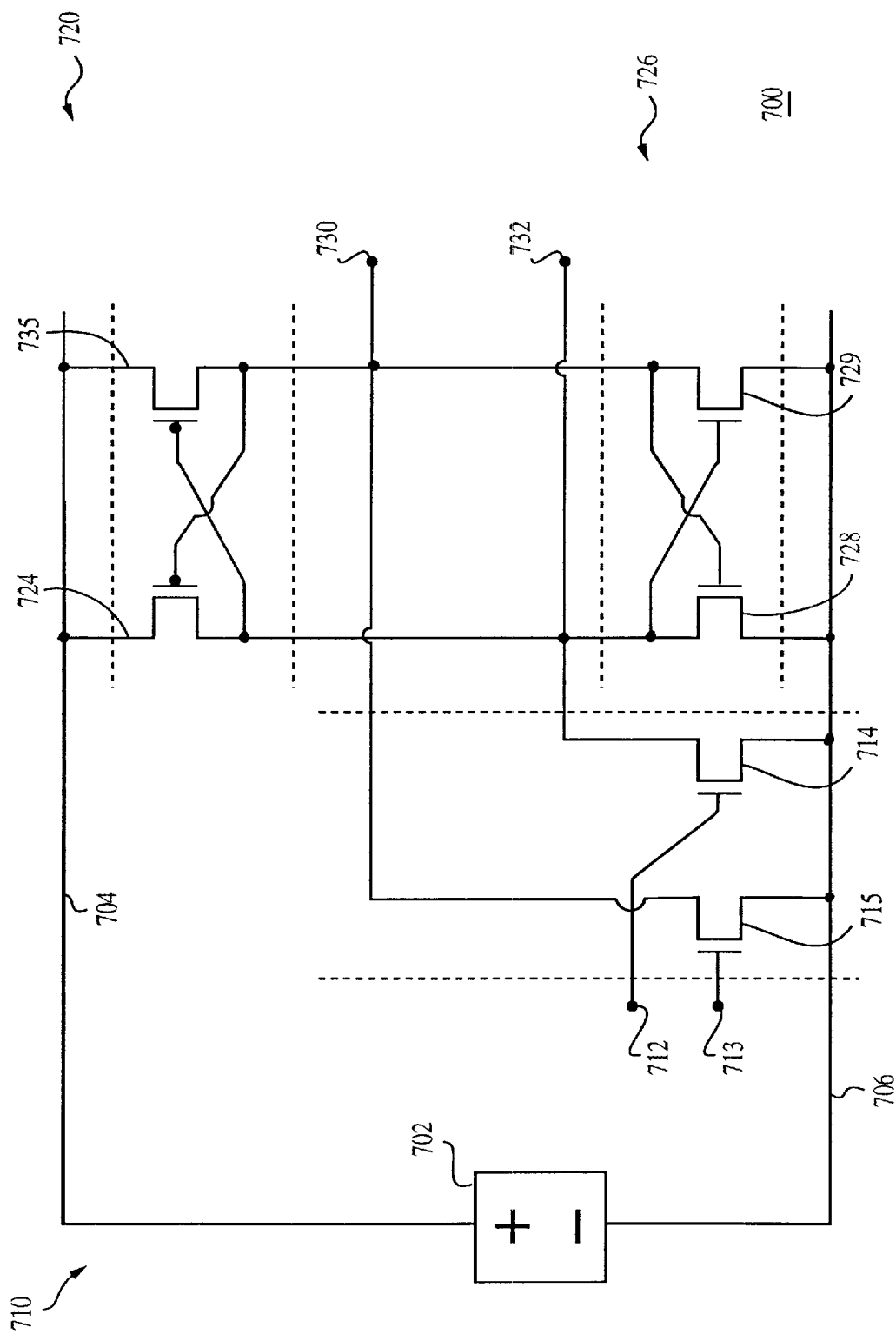
FIG. 7 is an RS-latch for an ADC.

FIG. 2 is a block diagram of an embodiment of an analog latch incorporating a first and a second preamplifier according to FIGS. 3 and 4, a level shifter according to FIG. 5, one or more differential analog latch stages of FIG. 6 and an RS latch of FIG. 7. FIG. 2 depicts an analog latch 200 with a first clocked preamplifier 202, a second clocked preamplifier 212, a signal level shifter 222, first, second third and fourth differential clocked analog latch stages 232, 242, 252 and 262, the latch stages being the latch stages of FIG. 6. The final latch stage 262 connects to RS latch 272. The output 282 of the analog latch 200 then is routed to logic circuitry or detection circuitry 110 of an ADC 100. During operation, the analog latch receives control inputs and clock inputs from an auto-zero control and clock generator 102.

The first clocked preamplifier 202 accepts a reference voltage and an input analog signal, and amplifies the difference between those signals before sending them to a second clocked preamplifier 212. The second preamplifier 212 further amplifies the signals before routing them to the latch stages 222 et seq. In one embodiment, the first preamplifier has a gain factor of about 5 to 10. In one embodiment, the second preamplifier has a gain factor of about 3 to 5.

Together, the first two stages can amplify an input differential signal by a factor of about 15 to about 50. The first preamplifier also includes a comparator stage, and the output of the amplifiers will be a positive voltage signal if the input analog signal is greater than the reference voltage; otherwise, the output signal will be negative. If necessary, the output of the preamplifiers is sent to a voltage level shifter 222. The voltage level shifter 222 shifts the absolute voltage level of the output signal from the preamplifier stages before sending the signal to the latch stages, and provides low impedance outputs for the differential clocked analog latch stages.

A first clocked preamplifier 300 useful in the analog latch is depicted in FIG. 3. A preamplifier 300 adds a multiplexer and comparator section 350 (also known as a reference section), to an input section 310, an output section 320, a common mode feedback section 330, autozero section 350, and a power supply 302. Power supply 302 with positive voltage supply 304 and negative voltage supply or return 306 connects to the output sections and common mode feedback sections of the preamplifier 300. The input section 310 includes first and second input transistors 312 and cascode transistors 314 connected by their sources to the drains of the first and second input transistors 312. The cascode transistors 314 connect to output terminals 324 of the amplifier. A bias voltage 326 may be applied to the gates of transistors 314 to control their operation.

The output section includes current source transistors 322 connected to the positive voltage supply 304 and to output terminals 324. A bias voltage 323 may be applied to the gates of transistors 322 to control their operation. The output section also includes common mode feedback loop 330, including common mode feedback transistors 332, 334, connected with a common source to second tail current source transistor 336.

The current source circuit is completed by first tail current source transistor 318 connected between the sources of the first and second input transistors 312 and the voltage supply return 306. The second tail current source transistor 336 also connects to the voltage supply return 306 and has its gate connected to its drain. The autozero section 340 includes first and second autozero capacitors 346 connected between gates of the input transistors 312 and the comparator section 350. A signal applied to combined gates 342 of the autozero transistors 344 shorts gates of the input transistors 312 to the output terminals 324.

The comparator or reference section 350 includes portions for connecting a reference voltage signal and an input voltage signal, a reference enable signal, and an input enable signal. Reference section 350 includes input voltage terminals 352 and input voltage transistors 354 and 356, connected with the autozero capacitors 346. In one embodiment, input terminals 352 are the input terminals for a time-varying input signal for the preamplifier. A differential voltage signal applied to the input terminals 352 will pass through transistors 354, 356 to capacitors 346. The input voltage will then travel through the capacitors 346 and appear at the input transistors 312 for amplification by the preamplifier 300. In one embodiment, an input enable circuit 380 connects to the gates of the input voltage transistors 354, 356, allowing for a signal to turn on the transistors and pass an input differential voltage signal.

Reference voltage terminals 362 and reference voltage transistors 364, 366, connect in parallel with the input voltage transistors 354, 356, to the autozero capacitors 346, and thus to the input transistors 312. In one embodiment, the preamplifier 300 also includes a reference enable circuit 370 connected to gates of the reference voltage transistors 364, 366. A signal applied to the gates of the reference voltage transistors 364, 366 turns on the transistors 364, 366 and allows a reference voltage signal to be applied to the autozero capacitors 346 and thence to the input transistors 312 of the preamplifier. Reference voltage transistors 364, 366, are depicted in FIG. 3 as NMOS. In other embodiments, PMOS transistors may be used. In yet other embodiments, both NMOS and PMOS transistors may be used.

The reference voltage section and reference enable sections allow a comparison of the input voltage to the reference voltage. If the input voltage is greater than the reference voltage, the signal output signal is positive. If the input voltage is less than the reference voltage, the output signal is negative.

The comparator or reference section 350 works as follows. A control signal is applied to the gates 342 of autozero transistors 344. This shorts the output voltage of the preamplifier terminals to one plate of capacitors 344. During the auto-zero operation, no reset signal is applied, so the outputs of the preamplifier have nearly the same value as the input offset voltage. The autozero control is kept turned on and a control signal is applied to the reference enable terminal 370 and thence to the gates of transistors 364, 366. A reference voltage is then applied to terminals 362 of reference enable transistors 364 and 366 and passes through to one plate each of capacitors 346. Now, both plates of the auto-zero capacitors are connected to low-impedance voltage nodes and thus they can store charge. The stored charge corresponds to the reference voltage and output offset of the amplifier.

The output offset of the amplifier differs by a residual offset value from the input offset of the preamplifier. Following this, the reference enable transistors 364, 366 and the auto-zero transistors 344 are turned off and the reference voltage and output offset of the preamplifier are stored on the capacitors 346. A control voltage is than applied to the input enable circuit 380 and then to the gates of differential input voltage transistors 354 and 356. An input voltage is applied to terminals 352 of transistors 354 and 356 then passes through to capacitors 346, where the voltages add or subtract from the reference voltage left by the reference and auto-zero enable operation.

Since the auto-zero transistors 344 suffer from leakage current in the turn-off state, the charge and thus the voltage degrades after a few hundred microseconds, a period of time corresponding to a few hundred thousand sampling cycles. It is therefore necessary to repeat the auto-zero and reference enable operations every few hundred microseconds. The preamplifier continually resets, auto-zeroes, and places a reference voltage on the auto-zero capacitors. When not engaged in an auto-zero operation, the preamplifier rests in the first half of every clock cycle and amplifies the difference between the input voltage and the reference voltage, comparing them in the second half of every clock cycle. The preamplifier of FIG. 3 is useful in a first stage of amplifying an analog signal for analog to digital conversion. In one embodiment, the amplifier of FIG. 3 has a gain factor of 3 to 5. In another embodiment, the amplifier has a gain of 5 to 10. Other embodiments are possible.

Besides a first stage of amplification, a second stage may also be desired. A second stage of amplification is possible with the preamplifier of FIG. 4. Preamplifier 400 includes an input section 410, an output section 420, and a common mode feedback section 430, an autozero section 440, and also receiving reset and autozero signals from a clock generator. The preamplifier works in the manner described above for FIG. 3, but without the comparator/reference section. The input section 410 includes first and second input transistors 412 and cascode transistors 414 connected to the first and second input transistors 412. The cascode transistors 414 connect to output terminals 424 of the amplifier. The output section includes current source transistors 422 connected to output terminals 424. A bias voltage 426 may be applied to the gates of cascode transistors 414 to control their operation; a bias voltage 423 may be applied to the gates of current source transistors 422 to control their operation.

The output section also includes common mode feedback loop 430, including common mode feedback transistors 432, 434, connected with a common source to second tail current source transistor 436. The current source circuit is completed by first tail current source transistor 418 connected to the sources of the first and second input transistors 412. The second tail current source transistor 436 also connects to the first tail current source transistor through its source and has its gate connected to its drain. The autozero section 440 includes first and second autozero capacitors 446 connected between gates of the input transistors 412 and input terminals 452. A signal applied to combined gates 442 of the autozero transistors 444 shorts gates of the input transistors 412 to the output terminals 424.

Using combined first and second preamplifier stages, a gain of from 15 to 50 may be realized from a small differential input voltage signal. Before the signal is routed to one or more latch stages, it may be useful to shift the absolute voltage level (with respect to ground or other desired reference level) of the signal. The voltage shifter 500 of FIG. 5 shifts the signal voltage level to a desired level. Typical input voltage to the shifter is 0.9 volts to 1.2 volts. The range of voltage inputs that works well with the latch stages and RS latches of FIGS. 3 and 4 is from about 0.2 volts to about 0.7 volts. The circuit of FIG. 5 accomplishes this level shift. The shifter 500 has a voltage supply 502, with a positive voltage rail 504 and a return or negative voltage rail 506. A differential voltage signal, desirably the output signal from one or more preamplifier stages, is connected to input terminals 508, the gates of input transistors 510. Transistors 510 are buffer amplifiers joined to current sources 512. In this configuration, about 2 dB attenuation of the input voltage signal results, and the signal is shifted by Vgs+I1·R1 or Vgs+I2·R2, where I1 and I2 are the currents shown in FIG. 5 and R1 and R2 are the transconductances of the input transistors 510. Other embodiments are also possible. The output voltage of the level shifter 500 is taken at the output terminals 516 and routed to a first differential analog latch stage, as depicted in FIG. 6. Other voltage level shifters may also be used.

FIG. 6 is such a clocked differential analog latch stage useful in ADCs. FIG. 6 depicts a high-speed clocked analog latch stage 600. The latch 600 has an input section 610, an output section 620 and an amplification section 630. The input section may include a voltage supply 602, having a positive rail 604 and a return or negative rail 606. The input section also includes a tail current source transistor 612 connected to the positive rail 604, and sending a constant current to two input transconductance transistors 624. The transconductance transistors 624 are preferably matched, that is having equal transconductance or W/L of the p-channel between their source and drain. The sources of the transistors 624 are connected to the tail current source transistor 612 and the drains of the transconductance transistors 624 are connected to the amplification section 630.

The input section 610 has a gain in the range of 0.5 to 2 and an output impedance in accord with the transconductance of the input transistors 624, preferably low. The latch section 630 has very high gain, in accordance with its configuration. The latch has first and second amplifier transistors 636, with the drain of the first transistor connected to the gate of the second transistor, and the gate of the second transistor connected to the gate of the first transistor. The sources of the amplifier transistors 636 are connected to the return rail 606 of the voltage supply 602. The latch section 630 amplifies the voltage signal from the input section 610 by a very high gain, as high as a factor of 20,000 or more, over a time period from about 100 ps to about 1 microsecond. Thus, an input signal of 1 microvolt may be amplified to an output signal of 20 millivolts. The amplified signal is applied at output terminals 632. In one embodiment, the output terminals connect to another clocked analog latch in series. In another embodiment, the output terminals connect to an RS latch, holding the output high or low voltage for a longer period of time. The output terminals need not be discrete components, but may be any point of contact between traces or conductive paths of the latch. Thus, the word "terminal," whether applied to input terminals, output terminals, or a point of input voltage or current to any drain, source or gate, may mean any point of contact, rather than a specific component meant to be assembled.

The amplifier works in the following manner. Current from the tail current source transistor 612 is routed through the first transconductance amplifier 624 or the second transconductance amplifier 625 in accordance with their relative transconductances and the voltage differential applied to the gates of the input transistors 624, 625. If a higher voltage is applied to the gate of PMOS transistor 625, it will turn off while PMOS transistor 624, with a lower voltage at its gate, may turn on. A higher voltage thus appears at the drain of transistor 625, higher than the voltage at the drain of transistor 624. Higher voltage at the drain of transistor 625 causes higher voltage at the drain of positive feedback NMOS amplifier transistor 634, turning transistor 634 ON, while the lower voltage at the drain of 624 causes lower voltage at the drain of transistor 635, causing it to turn OFF. With transistor 635, the voltage at its drain goes high, reinforcing the effect of the higher voltage at the drain of transistor 625. At transistor 634, the opposite effect occurs, the transistor 634 turning ON and the drain going low, again reinforcing the effect of turned on input transistor 624. With the arrangement of output terminals, the voltage is not inverted but is amplified by a factor of as much as 20,000 over a time period of less than 400 ps. Thus, a positive differential voltage input into the latch 600 is amplified and appears as a much greater ON signal at the output terminals 632 of the latch.

A reset transistor 628 is connected across the output terminals 632. The gate of the reset NMOS transistor is connected to a high-speed, clocked signal from the autozero control and clock generator module 102 of an ADC 100. The reset transistor 628, when turned on by the clocked signal, resets the outputs of the latch 600 to nearly equal voltage levels by shorting them together. Thus, the output of the latch stage is not valid during this portion of the cycle, when the reset transistor is on or HIGH, but rather, the output of the latch stage is valid when the reset transistor is off or LOW. During this portion of the clocked cycle, the high-speed amplifier will output a high signal (about 0.7 volts) or a low signal (about 0.1 volts), depending on the differential of the input voltage signal.

The differential clocked analog latch stage may be the most fundamental circuit in the entire ADC. Since an ADC may have many of these latch stages, it is important that their functioning and output be reliable. This may be particularly important when considering problems related to meta-stability. A meta-stability error occurs when the latch output signal does not properly indicate a logical high or low at its output. This may happen if the input signal is very low (in the range of a few nano-volts) and the gain of the latch stage (or more than one pipelined stages) is not high enough to construct voltage levels corresponding to the logical high or low at the output.

This error is particularly likely to occur in very short clock cycles, especially ones approaching 1 GHz. One way that has been found to insure the reliability of the signal is to pipeline several such latches in series.

The differential signal input to the first differential clocked analog latch stage is the output of a preamplifier, routed through a level shifter, and the input of the other latches is the output signal from the previous latch. The total gain of the pipelined latch structure is equal to the multiplication of the gain of each latch stage. If the gain of each stage is 20,000, the gain of four stages in a pipeline will be 20,000·20,000·20,000·20,000,=1.6×10$^{17}$. More latches may be used if greater reliability is desired; fewer than four latches may be used if less reliability in the conversion of analog signals, especially that in meta-stable states, to digital output voltages is acceptable.

After an analog signal passes through one or more stages of an analog latch, it is desirable to route the signal to a latch with more stable states for transmission to other parts of an ADC. FIG. 7 thus depicts an RS latch 700. The RS latch 700 has an input section 710 and a latch section including latches 720 and 726. The input section 710 desirably includes a voltage supply 702 with a positive voltage rail 704 and a negative rail or return 706. Input transistors 714 receive a differential voltage signal at input terminals 712, 713, gates of the input transistors 714, 715. The latches include a PMOS latch 720 and an NMOS latch 726. Latch 720 has PMOS transistors 724, 735 connected with the drain of one transistor connected to the gate of the other. Latch 726 has NMOS transistors 728, 729 connected with the drain of one transistor connected to the gate of the other. The output section also includes output terminals 730, 732.

If a high voltage is applied to terminal 712 and the gate of transistor 714, the drain of transistor 714 is turned on, the drain of transistor 714 is brought low, and also the gates of transistors 735 and 729. Transistor 735 is turned ON, transistor 729 is turned OFF, and a high signal appears at terminal 730. If at the same time a low signal is applied to terminal 713, input transistor 715 is turned off, with a high signal at terminal 730, and at the gates of transistors 724 and 728. Transistor 724 is turned off, transistor 728 is turned on, and a low signal appears at terminal 732. Thus the signals at terminals 730 and 732 are high/low, matching the input hi-low signals.

However, the RS latch of FIG. 7 is not clocked, as are the analog latches of FIG. 6, so that the output of the RS latch is now far more stable, ready for output as a digital signal. The output of the RS latch stays after the previous latch stage is forced into a reset state, since the differential output of the previous stage is nearly zero.

Figure 8:
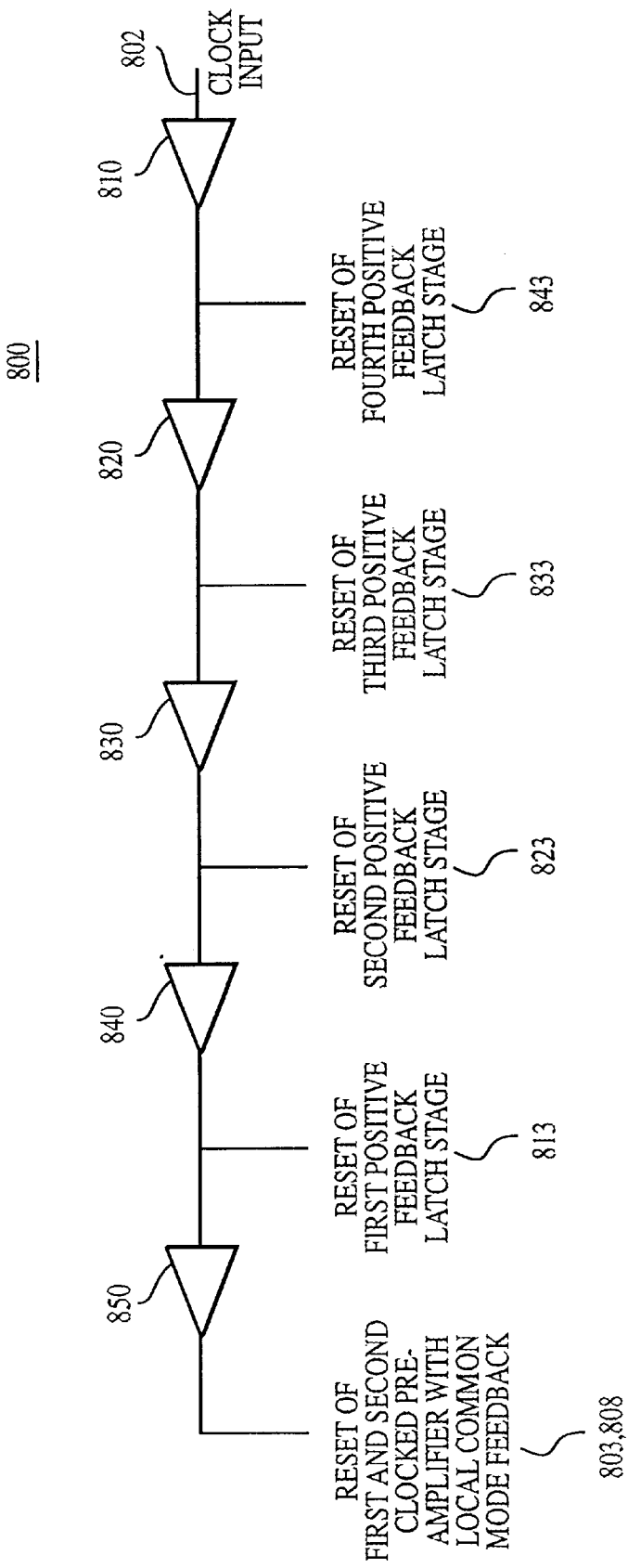
FIG. 8 is a block diagram of a clock-generator for 4 pipeline stages and a first and second preamplifier.

FIG. 8 depicts an embodiment of a simple clock generator an ADC analog latch having a four-stage pipeline latch and two preamplifiers discussed above. The clock generator 800 receives a clock signal input 802 from an oscillator, such as a crystal oscillator (not shown). The signal is preferably a time varying signal at a speed sufficient for high speed clocking operations. One embodiment is an input clock speed from 100 MHz to several GHz. Other embodiments may be used. Note that the RS latch does not receive a clock signal, since its output is stable. This design ensures that each stage of the latch stages begins its amplifying operation (during one half of each clock period) before the previous stage goes into a reset operation.

The clock input is amplified or processed as desired, such as by inverting, by a first amplifier 810. The signal output from the first amplifier 810 serves as an input signal to a fourth latch stage 843 and to a second inverter 820. The second inverter processes the signal and sends it to a third latch stage 833 and to a third inverter 830. The third inverter 830 processes the signal and sends it to a second latch stage 823 and to a fourth inverter 840. Fourth inverter 840 processes the clock signal and send to a first latch stage 813 and to a fifth inverter 850. The fifth inverter sends clock signals to first and second clock preamplifiers 803, 808.

Although only a few embodiments of the invention have been discussed, other embodiments are contemplated. For example, analog latches may be required in many other kinds of instruments or circuits requiring a reliable indication of a digital signal. It is therefore intended that the foregoing description illustrates rather than limits this invention, and that it is the following claims, including all equivalents, which define this invention. Of course, it should be understood that a wide range of changes and modifications may be made to the embodiments described above. Accordingly, it is the intention of the applicants to protect all variations and modifications within the valid scope of the present invention.

What is claimed is:

1. An analog latch, comprising:
    a first preamplifier and a second preamplifier, series connected and receiving a differential voltage signal and acting to amplify the differential voltage signal, and to output the differential voltage signal;
    at least one differential clocked analog latch stage, the at least one differential clocked analog latch stage comprising no more than six transistors, receiving the differential voltage signal from the first and second preamplifiers and producing a high signal or a low signal dependent on the differential voltage signal received,
    an RS latch, connected in series to the at least one differential analog latch stage, receiving and holding the high signal or low signal from the at least one analog latch stage, and
    a clock generator, producing control signals for the first preamplifier, the second preamplifier, and the at least one analog latch stage,
    wherein the clock generator generates control signals for the first preamplifier, the second preamplifier, and the at least one analog latch stage, the control signals including timing signals, autozero signals and reset signals.

2. The analog latch of claim 1, wherein the at least one differential clocked analog latch stage includes an input section, the input section having a differential amplifier series connected through a tail current source transistor to a positive voltage supply, and an output section having a latch connected in series to the differential amplifier at output terminals of the analog latch stage, and also including a reset transistor, connected across the output terminals, the reset transistor resetting the output section to equal voltage levels in response to a clocked reset signal.

3. The analog latch of claim 2, wherein the differential amplifier includes two PMOS transistors receiving a differential voltage signal.

4. The analog latch of claim 3, further comprising at least one additional differential clocked analog latch stage, connected between the at least one differential clocked analog latch stage and the RS latch, the at least one additional differential clocked analog latch stage receiving a high signal or a low signal from the at least one differential clocked analog latch stage and producing a high signal or a low signal for the RS latch, and wherein the clock generator also produces a control signal for each additional differential clocked analog latch stage.

5. The analog latch of claim 1, further comprising a level shifter connected between the second preamplifier and the at least one differential clocked analog latch stage, the level shifter shifting a voltage level of the signal from the second preamplifier.

6. The analog latch of claim 1, wherein the RS latch comprises an input section and a latch section, the input section comprising two input transistors, and the latch section comprising first and second latches connected in parallel with outputs from the input transistors, the first latch having two PMOS transistors and the second latch having two NMOS transistors, an output of the RS latch taken at output terminals connected to the inputs of the latch section, the output signals in response to the input signals from a differential clocked analog latch stage.

7. The analog latch stage of claim 6 wherein the RS latch comprises an input section and a latch section, the input section comprising two input transistors, gates of the input transistors receiving the input signals from the at least one differential clocked analog latch stage; and the latch section comprising first and second latches connected in parallel with drains of the input transistors, the first latch having first and second PMOS transistors and the second latch having first and second NMOS transistors, the sources of the PMOS transistors connected to a positive voltage supply and the sources of the NMOS transistors connected to a return of the voltage supply, and a gate of the first PMOS transistor connected to a drain of the second PMOS transistor and a gate of the second PMOS transistor connected to a drain of the first PMOS transistor, and a gate of the first NMOS transistor connected to a drain of the second NMOS transistor and a gate of the second NMOS transistors connected to a drain of the first NMOS transistor; and an output of the RS latch taken at output terminals connected to the inputs of the latch section, the output signals in response to the input signals from a latch stage.

8. The analog latch of claim 1, wherein the first preamplifier comprises an input section, an output section, a reference section, and an autozero section, and wherein the input section has a first transistor and a second transistor connected in parallel to a positive voltage supply;

a current source transistor, connected to a negative voltage supply;

first and second input transistors connected in parallel to the current source transistor;

first and second cascode transistors connected in series with the first and second input transistors and forming points of connection with the source and drain of the reset transistor, said points of connection being output terminals of the preamplifier, and wherein the output section has a common mode feedback loop, the loop comprising two transistors connected in parallel with the current sources for the output section, the output signal applied to gates of the feedback loop transistors, and a second tail current source transistor completing the feedback loop, said second tail current source transistor connected with the first tail current source transistor as a current mirror, and a gate of the second tail source transistor connected to a drain of the second tail source transistor, wherein a common mode voltage feedback to a gate of the first tail source transistor is set by a supply voltage less a voltage drop across the feedback transistors, and the output section also has output terminals connected across the gates of the feedback loop transistors, and a reset transistor connected to the output terminals, the reset transistor responsive to a control signal applied to a gate of the reset transistor; and wherein the autozero section has first and second autozero transistors connected with the first and second input transistors, and first and second capacitors connected with the first and second autozero transistors, the drains of the autozero transistors connected to the output terminals, the autozero transistors responsive to a control signal applied to gates of the autozero transistors; and wherein the reference section has first and second input voltage transistors and first and second reference voltage transistors connected in parallel with the capacitors, gates of the input voltage transistors connected to an input enable terminal, and gates of the reference voltage transistors connected to a reference enable terminal, the input voltage transistors being responsive to an input enable signal and the reference voltage transistors being responsive to a reference enable signal, wherein a differential voltage applied to gates of the input voltage transistors is amplified and an output signal is formed and applied to the output terminals.

9. The analog latch of claim 8, further comprising a second preamplifier stage, the second preamplifier stage receiving input signals from the first preamplifier and producing an amplified output to the input section of the analog latch stage.

10. The analog latch of claim 8, wherein the first transistor and the second transistor connected to the positive voltage supply are PMOS.

11. The analog latch of claim 9, wherein the second preamplifier stage comprises a preamplifier input section, a preamplifier output section having a common mode feedback loop, and a preamplifier autozero section.

12. The analog latch of claim 11, wherein the input section includes a first NMOS transistor and a second NMOS transistor connected to a positive voltage supply.

13. The analog latch of claim 1, wherein the clock generator control signals include a reference enable signal and an input enable signal.

14. The analog latch of claim 1, wherein the differential clocked analog latch stage comprises six transistors only.

15. The analog latch of claim 1, wherein the RS latch comprises six transistors only.

16. An analog latch circuit, comprising:

at least one differential clocked analog latch stage, the at least one differential clocked analog latch stage comprising no more than six transistors, producing an output high or low signal in response to an input signal;

an RS latch receiving a high or low signal from the at least one analog latch stage;

a clock generator, wherein the clock generator produces control signals for the at least one analog latch stage, and a first preamplifier, the preamplifier receiving and amplifying an input signal, and producing an output signal for the at least one differential clocked analog latch stage, and wherein the clock generator produces control signals for the first preamplifier.

17. The analog latch circuit of claim 16, further comprising a second preamplifier connected between the first preamplifier and the at least one differential clocked analog latch stage, the second preamplifier receiving a signal from the first preamplifier and producing an output signal for the at least one analog latch stage, and wherein the clock generator produces control signals for the second preamplifier.

18. The analog latch circuit of claim 17, wherein the first preamplifier and the second preamplifier each have an output section having a common mode feedback loop.

19. The analog latch circuit of claim 17, wherein a combined gain of the first preamplifier and the second preamplifier is from about 15 to about 50.

20. The analog latch circuit of claim 17, further comprising a level shifter between the second preamplifier and the at least one differential clocked analog latch stage, the level shifter shifting an absolute voltage level of the signal from the second preamplifier and communicating the signal to the at least one analog latch stage.

21. The analog latch of claim 11, wherein a combined gain of the first preamplifier and the second preamplifier is from about 15 to about 50.

22. The analog latch circuit of claim 20, wherein the at least one differential clocked analog latch stage further comprises an input section, an output section, and an amplification section, the input section having at least one tail current source and two transconductance transistors.

23. The analog latch circuit of claim 17, wherein the clock generator produces an autozero signal, a reference enable signal and an input enable signal for the first preamplifier and the second preamplifier.

24. The analog latch circuit of claim 17, wherein the clock generator produces a reset signal for the first and second amplifiers.

25. The analog latch circuit of claim 19, wherein the circuit comprises four differential clocked analog latch stages in a pipeline, each latch stage receiving sequential reset signals from the clock generator.

26. The analog latch circuit of claim 25, wherein each of the four differential clocked analog latch stages has a tail current source.

27. The analog latch circuit of claim 16, wherein the RS latch comprises six transistors only.

28. An analog latch circuit, comprising:
at least one differential clocked analog latch stage, wherein the analog latch stage comprises six transistors only;
an RS latch receiving a high or low signal from the at least one analog latch stage;
a clock generator, wherein the clock generator produces control signals for the at least one analog latch stage;
a first preamplifier, the preamplifier receiving and amplifying an input signal, and producing an output signal for the at least one differential clocked analog latch stage; and
a second preamplifier connected between the first preamplifier and the at least one differential clocked analog latch stage.

29. The analog latch circuit of claim 28, wherein the RS latch comprises six transistors only.

30. An analog latch, comprising:
a first preamplifier and a second preamplifier, series connected and receiving a differential voltage signal and acting to amplify the differential voltage signal;
at least one differential clocked analog latch stage, the at least one differential clocked analog latch stage comprising no more than six transistors, connected in series with the second amplifier;
an RS latch, connected in series to the at least one differential analog latch stage; and
a clock generator, producing control signals for the first preamplifier, the second preamplifier.

31. The analog latch according to claim 30, wherein the analog latch stage comprises six transistors only.

32. The analog latch of claim 30, wherein the RS latch comprises six transistors only.

* * * * *